United States Patent
Tedrow et al.

(10) Patent No.: US 6,772,273 B1
(45) Date of Patent: Aug. 3, 2004

(54) BLOCK-LEVEL READ WHILE WRITE METHOD AND APPARATUS

(75) Inventors: Kerry D. Tedrow, Folsom, CA (US); Mark E. Bauer, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 300 days.

(21) Appl. No.: 09/608,454

(22) Filed: Jun. 29, 2000

(51) Int. Cl.$^7$ .............................................. G06F 12/00
(52) U.S. Cl. .................. 711/103; 711/168; 365/189.04; 365/230.03
(58) Field of Search ................................ 711/101, 103, 711/129, 150, 168, 173; 365/185.11–185.33, 230.03, 189.04, 45

(56) References Cited

U.S. PATENT DOCUMENTS

| | | | |
|---|---|---|---|
| 5,245,570 A | * 9/1993 | Fazio et al. ............ | 365/185.13 |
| 5,245,572 A | 9/1993 | Kosonocky et al. ... | 365/185.11 |
| 5,361,343 A | 11/1994 | Kosonocky et al. ... | 365/185.11 |
| 5,648,929 A | 7/1997 | Miyamoto ............. | 365/185.04 |
| 5,701,143 A | * 12/1997 | Rao ........................... | 345/545 |
| 5,748,528 A | 5/1998 | Campardo et al. ..... | 365/185.13 |
| 5,796,657 A | 8/1998 | Lee et al. .............. | 365/185.11 |
| 5,847,998 A | 12/1998 | Van Buskirk | |
| 5,867,430 A | 2/1999 | Chen et al. ............ | 365/189.04 |
| 5,894,437 A | 4/1999 | Chang et al. | |
| 5,896,340 A | * 4/1999 | Wong et al. ........... | 365/230.03 |
| 5,959,887 A | 9/1999 | Takashina et al. | |
| 5,995,415 A | * 11/1999 | Kuo et al. ............. | 365/185.11 |
| 6,005,803 A | * 12/1999 | Kuo et al. ............. | 365/185.11 |
| 6,091,619 A | * 7/2000 | Kogan .......................... | 365/45 |
| 6,262,918 B1 | 7/2001 | Estakhri et al. | |
| 6,310,805 B1 | * 10/2001 | Kasa et al. .................. | 365/200 |
| 6,351,413 B1 | * 2/2002 | Micheloni et al. ..... | 365/185.11 |
| 6,397,314 B1 | 5/2002 | Estakhri et al. | |

FOREIGN PATENT DOCUMENTS

| | | |
|---|---|---|
| EP | 0745995 A1 | 12/1996 |
| WO | 99/35650 | 7/1999 |

OTHER PUBLICATIONS

Monika Abele, Dreieich, Memory For Simultaneous Reading and Writing, XP–000870902, vol. 106, No. 11, pp. 802–804 (Nov. 1998).

Monika Abele, "Speicher fur simultanes Lesen und Screiben," F & M Feinwerktechnik Mikrotechnik Mikroelektronik, XP–000870902, vol. 106, No. 11, pp. 802–804 (Nov. 1998).

PCT Notification of Transmittal of The International Search Report or The Declaration for PCT Counterpart Application No. PCT/US01/19505 Containing International Search Report (Jan. 30, 2002).

"Mitsubishi Announces Background Operation Feature in High Density, 8–MBIT Dinor Mobile Flash Memory," Press Release, Mitsubishi Electronic Device Group, Mitsubishi Electronics America, Inc., http://www.mitsubishichips.com/press/releases/8dinor.html, Mar. 19, 1998, (3 pages).

"Sharp Electronics Corporation Announces Unique Dual–Task 4 Mbit Flash Memory, Single Device Capable of Simultaneous Read, Write, and Erase Operation," Product Release, Sharp Press Release, http://www.sharpmeg.com/press/LH28F040.html, Mar. 19, 1998 (2 pages).

"Flash Memory LH28F800SUTD," 8M Dual Work, Preliminary, Sharp Corporation, Dec. 9, 1996 (41 pages).

* cited by examiner

*Primary Examiner*—Nasser Moazzami
(74) *Attorney, Agent, or Firm*—Blakely, Sokoloff, Taylor & Zafman LLP (57) ABSTRACT

In one embodiment, a method and apparatus for reading one block of a nonvolatile memory device while writing to another block of a nonvolatile memory device is disclosed.

16 Claims, 6 Drawing Sheets

BLOCK-LEVEL READ WHILE WRITE METHOD AND APPARATUS

FIELD OF INVENTION

The present invention relates to flash memory, and more specifically, to partitioning of flash memory.

BACKGROUND OF THE INVENTION

Figure 1:
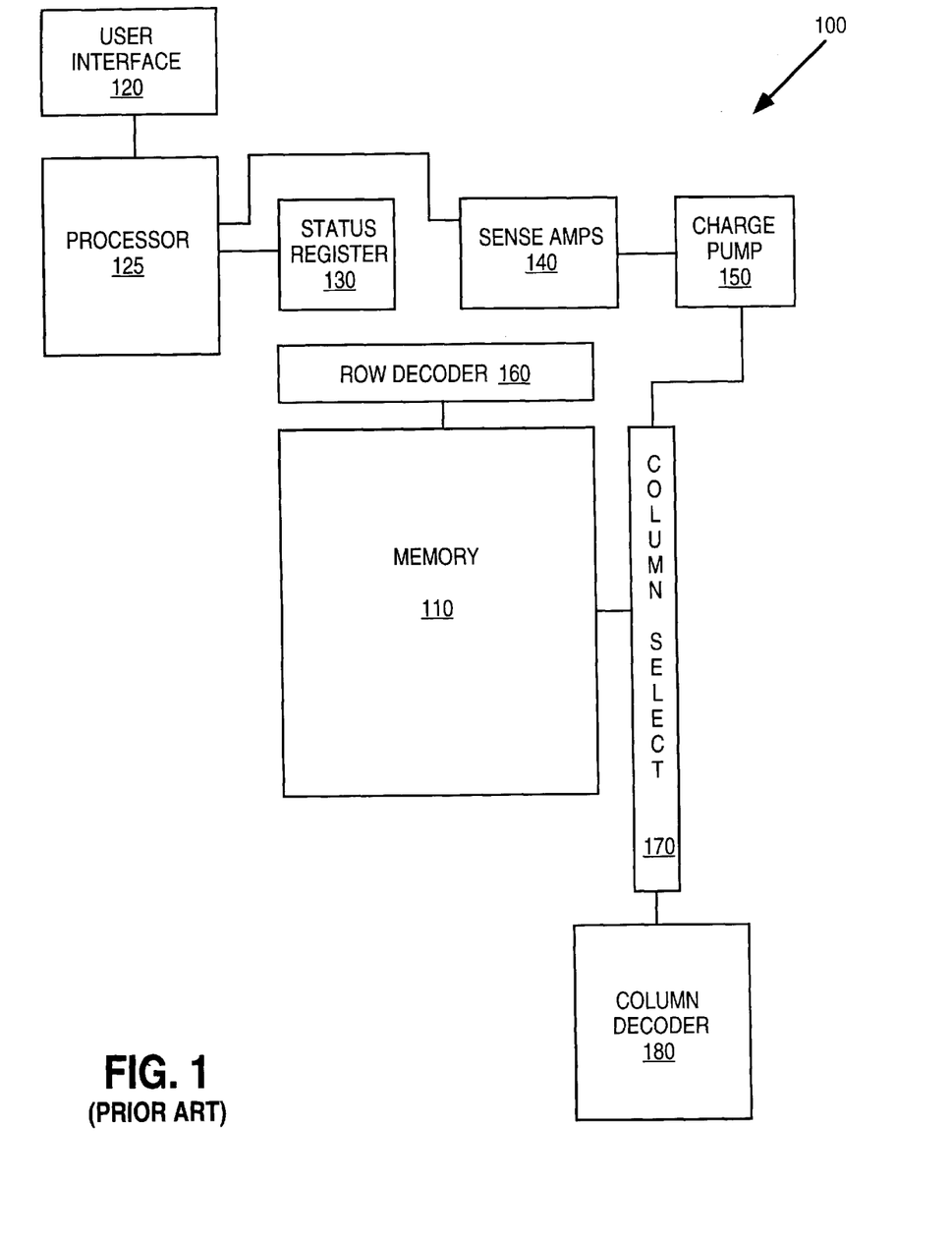
FIG. 1 shows a prior art flash memory device.

FIG. 1 illustrates one prior art flash memory device 100. The memory 110 into which data is written has a row decoder 160 and a column decoder 180 associated with it. The row decoder 160 and column decoder 180 permit addressing the rows and columns of memory. A user interface 120 controls the flash memory device 100. The user interface 120 interfaces with a processor that controls access to the memory 110. The processor knows the status of the flash memory from the user interface 120. A status register 130 stores the current status—programming, reading, or erasing—of the memory 110.

The memory is programmed when a cell's state is electrically changed from a one to a zero. In a typical prior art flash memory this operation has a resolution of a single cell (bit). Programming is typically performed by applying high positive voltage to the gate and drain of a flash cell. The memory is erased by electrically changing a cell's state from a zero to a one. In a typical prior art flash memory this operation has a resolution of 512K cells (block), and may be accomplished by applying negative voltage to the gate and positive voltage to the source. These two operations, programming and erasing, are also called writing. Thus, writing is performed by electrically altering the state of a cell (or cells), including both program and erase operations.

Sense amplifiers 140 are associated with the memory 110. In one prior art implementation, the sense amplifiers are used to amplify signals for writing to and reading from the memory 110. For a row divided into sixteen input/outputs (I/Os), sixteen sense amplifiers 140 are used for writing and reading, one for each I/O. A charge pump 150 is further included in the flash memory 100. The charge pump 150 is used to provide the voltage levels needed for reading from, programming, and erasing the memory 110. Generally, prior art flash memory devices have two partitions with multiple blocks in each partition.

Typically, a group of blocks form a partition. One partition may be used to store data, and another partition may be used to store code, for example. However, a user can not write to one block of the flash memory while simultaneously reading another block of the memory within the same partition using the prior art read while write memory.

Another disadvantage of the traditional read while write memory is that the number of blocks within a given partition is fixed. For example, if one partition is used to store code, and another partition is used to store data, and if the user does not know what the storage requirements for the code will be, the partition for the code may contain more blocks than are necessary. Thus, a portion of the memory will be unused. The supplier or manufacturer can reduce this waste by providing many partition options, but this increases line-item count which also increases costs.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and apparatus for block level read while write is described. An advantage of block level read while write is a more efficient use of all blocks within the flash memory. There is also a cost savings to the manufacturer, because the manufacturer does not have to support as many products to meet a customer's needs. There is a tangible cost savings in not having to keep an inventory of a large amount of different products.

In one embodiment of block level read while write, a nonvolatile memory device comprises a first block and a second block, where each block is able to be read while another block is written. The device may further include a first row decoder and a second row decoder. Each row decoder may be associated with a corresponding block. Also, a read global column decoder and a write global column decoder are associated with the blocks. A set of global column read lines and a set of global column write lines are associated with the corresponding global column decoders and each block. The device may further have a first local column decoder and a second local column decoder. Each local column decoder is associated with a corresponding block. A first local column decoder enable circuit and a second local column decoder enable circuit, associated with their corresponding local column decoders are also included in the device. Each local column decoder can be enabled to select either the read global column signal or the write global column signal.

Figure 2:
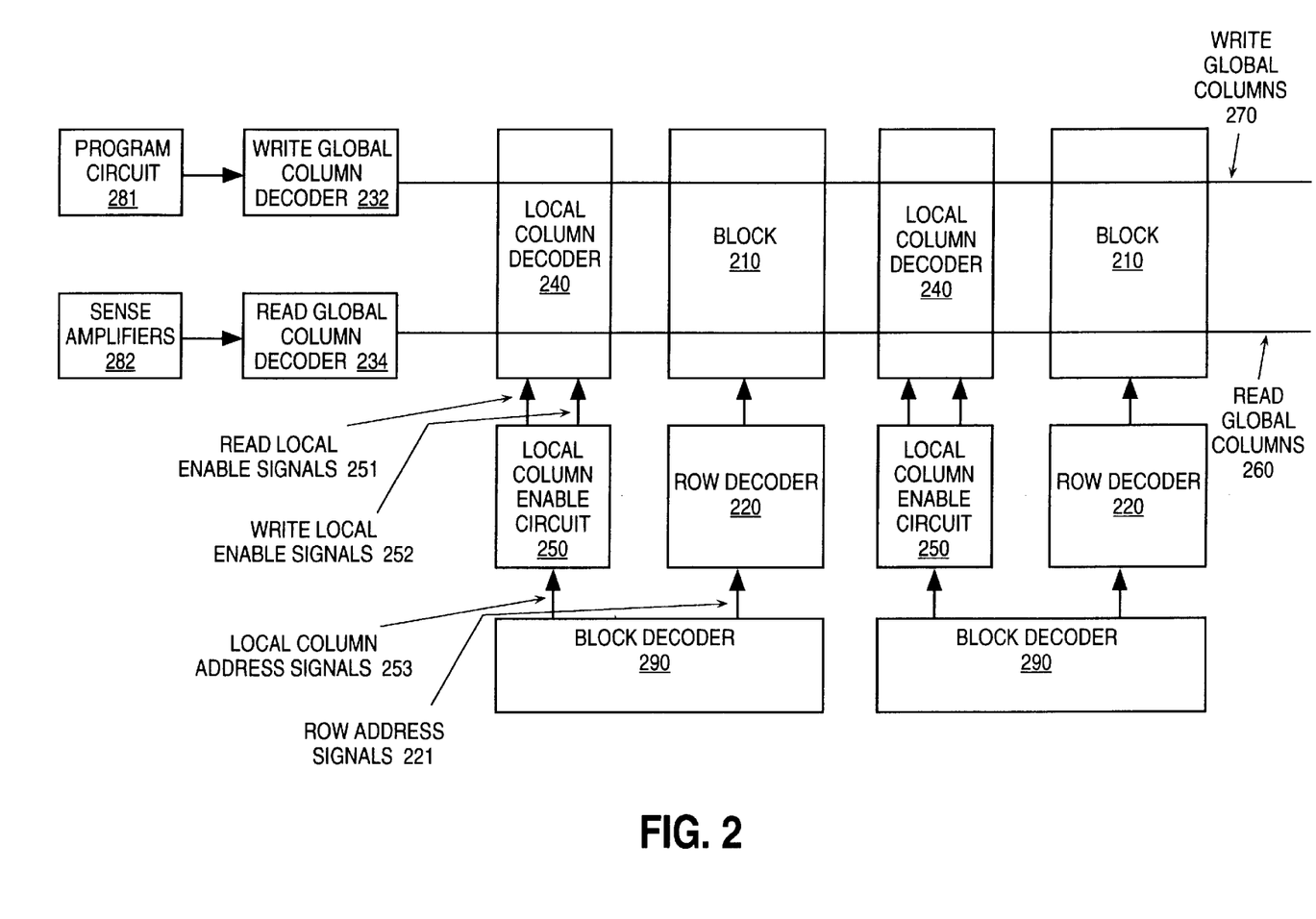
FIG. 2 shows an embodiment of a flexible read while write memory.

An embodiment of the block level read while write memory is shown in FIG. 2. The memory has block arrays 210, where each block 210 is the minimum number of cells that can be erased at one time. The cells of block 210 share a common source node, which requires all cells in the block to be erased simultaneously.

Each memory block 210 defines a memory section. A local row decoder 220 is associated with each block 210. Each block 210 is further associated with a write global column decoder 232 and a read global column decoder 234. The global column decoders eliminate the need for duplicating separate read and write column decoders for each block 210 within the memory, because multiple blocks share the global column decoders 232 and 234.

An advantage of using the global decoders in flash-memories is saving area. Each global decoder outputs signals which are used as input signals to the local decoder. A local decoder is provided for each block whereas the global decoder is shared between several blocks. Thus, the global column decoders reduce the amount of area on the integrated circuit chip needed to implement block level read while write.

For the embodiment shown in FIG. 2, each block 210 has a local column decoder 240. The local column decoder 240 is needed to eliminate a disturb situation, which may arise when a global column decoder is shared among multiple blocks. A disturb occurs when subjecting a cell to high voltage on the gate, drain, or source node while writing to other cells. Disturbs are a consequence of sharing row, column and source signals between cells. Excessive disturb times will alter the state of the flash-cell.

The effects of disturbs can be reduced by using local decoders. The local decoder provides block isolation to limit disturb time. For example, without the local column decoder 240, when one block is written to, the other blocks will be exposed to a high drain voltage, which may negatively impact the memory performance of the other blocks. However, with local column decoding, when a block is being written, the local column decoder will connect the global column decoder only with the block that is being written. The other blocks will be isolated from the high drain voltage, thus improving their performance. The local column decoder 240 provides electrical isolation so that only one block receives the write signal from the write global column decoder 232. In one embodiment, the local column decoder 240 can be two transistors for each column in a given block 210.

A read address is the address of the word to be read, and a write address is the address of the word or block to be written. If a given block is being written or read, the local column decoder 240 for the given block 210 is enabled by a signal from the local column enable device circuit 250.

Each global column decoder 232, 234 has a set of signal lines. One set of lines is a set of global read lines 260, and the other is a set of global write lines 270. Thus, the global column decoders can provide two sets of global signals, one for the block to be read, and the other for the block to be written. The two sets of global signals are needed to read from one block while writing to another block. The two sets of global signals provides the advantage of being able to read from one block while writing to another block. The two sets of global signals also provide the advantage of having the read while write resolution comprise a single block, so that the boundary between code and data partitions is flexible and can change at the block level.

The read global column decoder 234 is connected to sense amplifiers circuit 282. The sense amplifiers read data from a cell by testing the cell to determine if the cell draws current, or conducts. The write global column decoder 232 is connected to program circuit 281. The program circuit provides a high voltage needed to write to a cell of a memory block 210.

Each row decoder 220 and each local column enable circuit 250 receives address signals from block decoder 290. Block decoder 290 provides write address signals to the block being written and read address signals to the remaining blocks. Column enable circuit 250 receives local column address signals 253 from block decoder 290. Column enable circuit generates a set of read local signal lines 251 and a set of write local enable lines 252, for enabling the local column decoder to receive an appropriate signal from one of the global read lines 260 or global write lines 270. Row decoder 220 receives the row address signals 221 from block decoder 290.

Although the embodiment shown in FIG. 2 has two blocks, alternative embodiments may include any number of blocks, and therefore, have any number of partitions.

Figure 3:
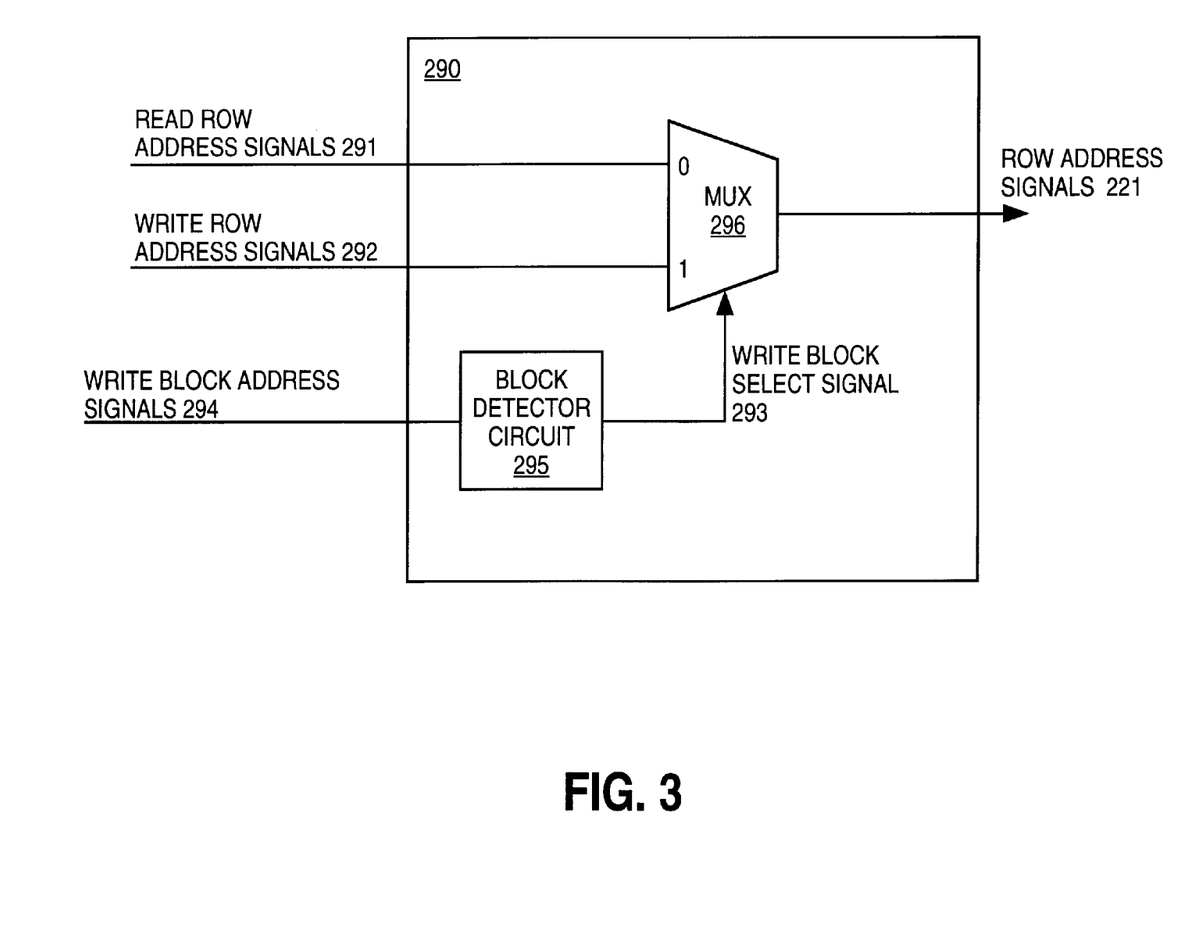
FIG. 3 shows another embodiment of reading while write memory.

FIG. 3 shows an embodiment of the row address generation portion of block decoder 290. Read and write row address signals 291 and 292 are received from a central processing unit (CPU) and input into multiplexer 296. Write block address signals 294 are received by block detection circuit 295. The block detection circuit is designed to detect the particular block address associated with its block. When the matching block address is detected the block detector outputs a high-level signal causing the multiplexer to transmit the write row address signals to row address signal output 221. If the matching address is not detected then the read row address signals are transmitted to the output.

Figure 4:
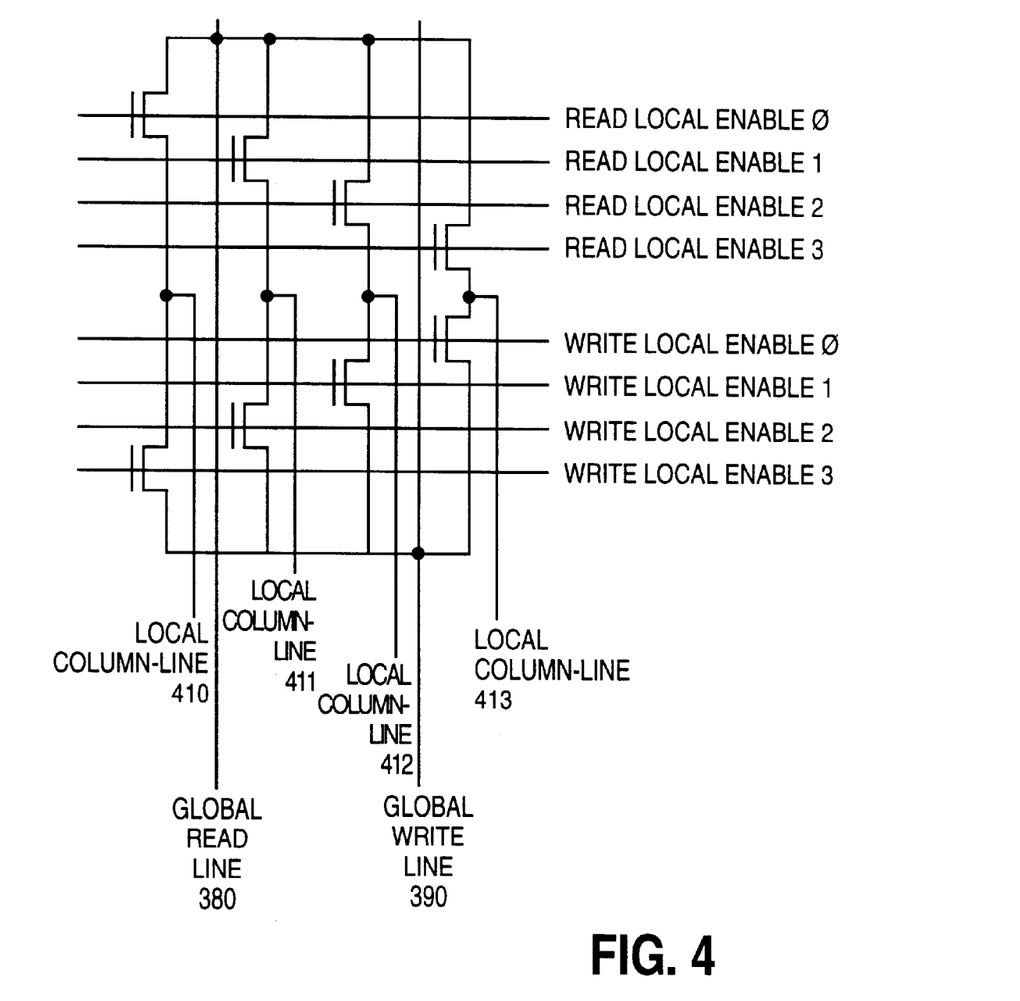
FIG. 4 shows an embodiment of reading or writing through a local bit line by enabling a global bit line.

FIG. 4 shows an embodiment of a portion of the local column decoder shown in FIG. 2. If a memory block has a row that is 1 kbit wide, then the local column decoder will have 1 k local column lines. If the read global column decoder has 256 global read lines and the write global column decoder has 256 global write lines, then one global read line and one global write line will be associated with four corresponding local column lines at the local column decoder. The local column enable circuit will enable the appropriate one of the four local column lines to receive the appropriate read or write signal from one of the global lines by enabling one of the eight local column enable lines.

A method for performing block-level read while write includes reading a first block of a nonvolatile memory while writing to a second block of a nonvolatile memory. A first local column decoder associated with the first block is enabled to select the global read lines. A second local column decoder associated with the second block is enabled to select the global write lines. The method includes sending a column read signal from a global column decoder to the first block, and sending a column write signal from a global column decoder to the second block. The column read signal is sent through the first local column decoder to the first block. The column write signal is sent through the second local column decoder to the second block.

Figure 5:
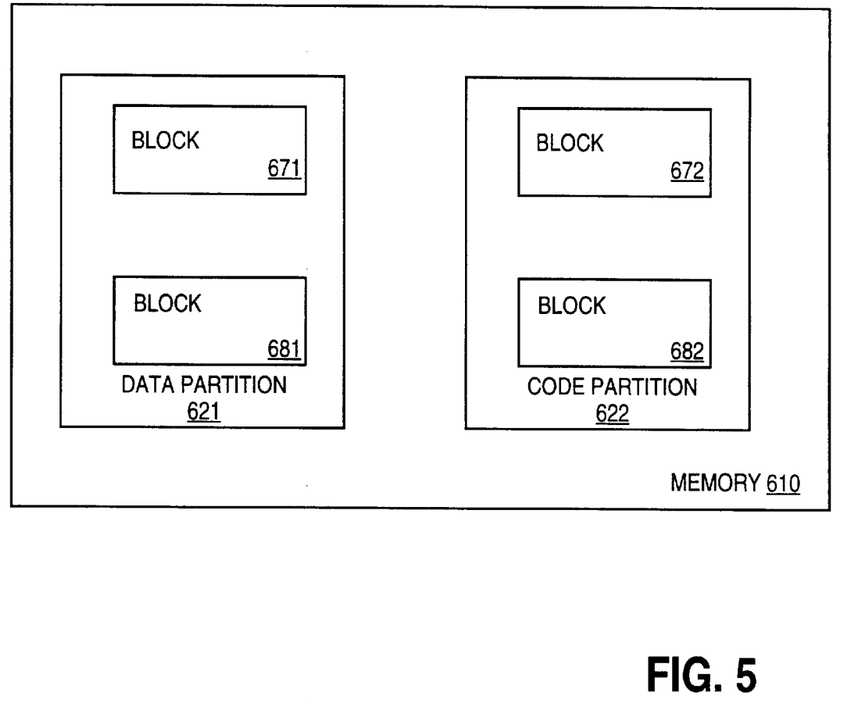
FIG. 5 shows an embodiment of reading to a block in one partition while writing to another block in the same partition.
Figure 6:
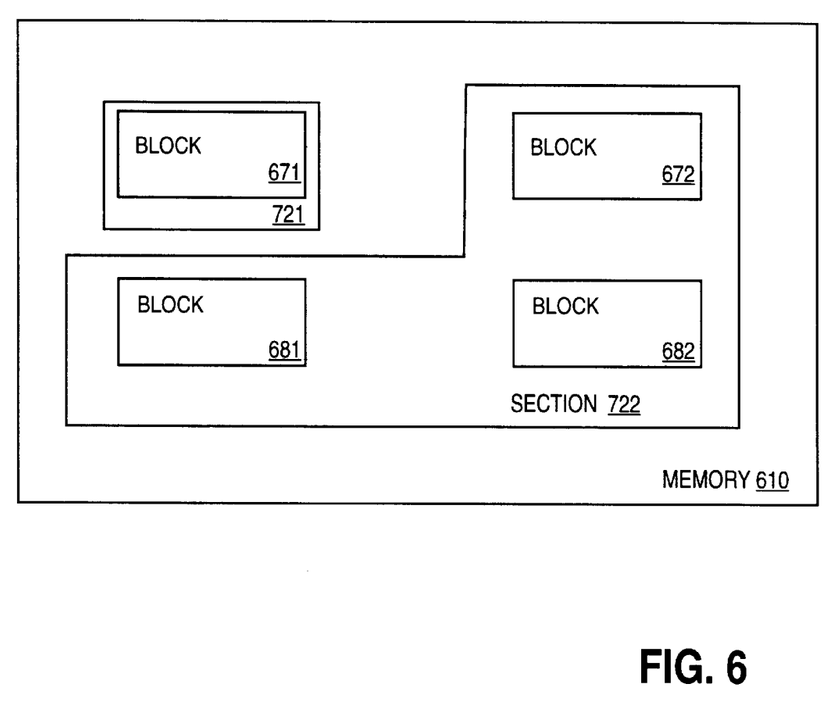
FIG. 6 shows an embodiment of a flexible block partitioning.

FIGS. 5 and 6 show another embodiment of a block level read while write memory device. Memory 610 has several sections 620. Each partition 62$n$ has several blocks 67$n$ and 68$n$. For block-level read while write, a processor can write to any block while reading from any other block.

In FIG. 6 the boundary between the code and data partitions of FIG. 5 has been redefined at the block level in order to increase the efficiency of the memory. For example, if only one block of memory is needed to store code, then this code can be stored in block 671. The other block in partition 621 of FIG. 5 can become a part of partition 722, as shown in FIG. 6. Thus, the partition 721 which contains the code will only have one memory block 671, and the other memory block 681 can be used to store data, for example, in partition 722, thus increasing the overall efficiency of memory 610.

One example of using a flash memory device having a block-level read while write apparatus is as follows. A first block may be used to store data. A second block may be used to store code that is executed by an apparatus that includes the flash memory device. The third block may be used to permit updating of the code. Thus, for example, if the code changes from an update, new code is written to the third block while the original code in the second block is concurrently executing. When the new code has been written and verified, the third block can become the partition used for the code. Thus, seamless updating of flash memory devices is possible. Another example of a flash memory device having a block-level read while write apparatus and method is having code executed from a first block, while updating data in a second block. Thus, for example, if the code execution results in an updating of data, this can be accomplished seamlessly.

In the foregoing specification, the invention has been described with reference to specific embodiments thereof. However, it is evident that various modifications and changes may be made thereto without departing from the broader spirit and scope of the invention. The specification and drawings are, accordingly, to be regarded in an illustrative rather than a restrictive sense. The present invention should not be construed as limited by such embodiments and examples, but rather construed according to the following claims.

What is claimed is:

1. A nonvolatile memory device comprising:
a memory including a first block and a second block, each block able to be read while another block is written;
a first row decoder associated with the first block to address only the first block;
a second row decoder associated with the second block to address only the second block;
a first local column decoder and a second local column decoder, each local column decoder associated with a corresponding block; and
a first local column enable circuit and a second local column enable circuit, associated with a corresponding local column decoder.

2. The device of claim 1 further comprising
a global column decoder associated with the memory.

3. The device of claim 2 further comprising
a set of read global column lines associated with the global column decoder and each block.

4. The device of claim 3 further comprising
a set of write global column lines associated with the global column decoder and each block.

5. The device of claim 1 wherein
a column read signal is sent over the read global column lines from the global column decoder to the first block through the corresponding local column decoder that is enabled to read the column read signal.

6. The device of claim 5 wherein
a column write signal is sent over the read global column lines from the global column decoder to the second block through the corresponding local column decoder that is enabled to read the column write signal, such that the global column decoder is in the read mode and the write mode simultaneously.

7. A method for reading a first block of a nonvolatile memory while writing to a second block of the nonvolatile memory comprising:
sending a column read signal from a global column decoder to the first block;
sending a column write signal from the global column decoder to the second block;
enabling a first local column decoder to receive the column address signal and electrically isolate only the first block; and
enabling a second local column decoder to receive the column write signal and electrically isolate only the second block.

8. The method of claim 7 further comprising
sending the column read signal through the first local column decoder to the first block.

9. The method of claim 8 further comprising
sending the column write signal through the second local column decoder to the second block, such that data is read from the first block while other data is simultaneously written to the second block.

10. An apparatus for reading a first block of a nonvolatile memory while writing to a second block of a nonvolatile memory comprising:
means for sending a column read signal from a global column decoder to the first block;
means for sending a column write signal from the global column decoder to the second block;
means for enabling a first local column decoder to receive the column read signal and electrically isolate only the first block; and
means for enabling a second local column decoder to receive the column write signal and electrically isolate only the second block.

11. The apparatus of claim 10 further comprising
means for sending the column read signal through the first local column decoder to the first block.

12. The apparatus of claim 11 further comprising
means for sending the column write signal through the second local column decoder to the second block.

13. A non-volatile memory device comprising:
a code partition to store code, said code partition having a first number of blocks, a first number of local row decoders and local column decoders, each decoder being associated with a corresponding block, and a first number of local column enable circuits, each local column enable circuit being associated with a corresponding local column decoder;
a data partition to store data, said data partition having a second number of blocks, and a second number of local row decoders, and local column decoders, each decoder being associated with a corresponding block; and a second number of local column enable circuits, each local column enable circuit being associated with a local column decoder; and
wherein each block is able to be read while another block is written.

14. The non-volatile memory device of claim 13 wherein the first number of blocks in the code partition can be redefined to include unused blocks from the second number of blocks in the data partition.

15. The non-volatile memory device of claim 13 wherein the second number of blocks in the data partition can be redefined to include unused blocks from the first number of blocks in the code partition.

16. A method comprising:
reading data from a section of a nonvolatile memory, the section of memory including first and second blocks and first and second local column decoders, each to electrically isolate only one block;
simultaneously writing data to the section of the nonvolatile memory;
placing a global decoder for the section in write mode;
simultaneously placing the global decoder in the read mode;
sending a column read signal through the first local column decoder to the first block; and
sending a column write signal through the second local column decoder to the second block.

* * * * *

UNITED STATES PATENT AND TRADEMARK OFFICE
CERTIFICATE OF CORRECTION

PATENT NO. : 6,772,273 B1
DATED : August 3, 2004
INVENTOR(S) : Tedrow et al.

It is certified that error appears in the above-identified patent and that said Letters Patent is hereby corrected as shown below:

Column 5,
Line 35, delete "1" and insert -- 4 --.

Signed and Sealed this

Second Day of November, 2004

JON W. DUDAS
*Director of the United States Patent and Trademark Office*